United States Patent [19]
Yaung et al.

[11] Patent Number: 5,926,697
[45] Date of Patent: Jul. 20, 1999

[54] METHOD OF FORMING A MOISTURE GUARD RING FOR INTEGRATED CIRCUIT APPLICATIONS

[75] Inventors: Dun-Nian Yaung, Taipei; Shou-Gwo Wuu, Hsin-Chu; Jin-Yuan Lee, Hsin-Chu; Hsien Wei Chin, Hsin-Chu, all of Taiwan

[73] Assignee: Taiwan Semiconductor Manufacturing Company, Ltd., Hsin-Chu, Taiwan

[21] Appl. No.: 08/947,793

[22] Filed: Oct. 9, 1997

[51] Int. Cl.$^6$ ................................................ H01L 21/76
[52] U.S. Cl. ........................... 438/132; 438/401; 438/454
[58] Field of Search ................................. 438/131, 132, 438/401, 454, FOR 221, FOR 433, FOR 435; 257/508, 630, 659, 488

[56] References Cited

U.S. PATENT DOCUMENTS

| | | |
|---|---|---|
| 4,978,630 | 12/1990 | Kim . |
| 5,087,577 | 2/1992 | Strack . |
| 5,444,012 | 8/1995 | Yoshizumi et al. . |
| 5,538,924 | 7/1996 | Chen . |
| 5,567,643 | 10/1996 | Lee et al. . |
| 5,750,414 | 5/1998 | Whitney . |
| 5,847,433 | 12/1998 | Kerber . |

*Primary Examiner*—George Fourson
*Attorney, Agent, or Firm*—George O. Saile; Stephen B. Ackerman

[57] ABSTRACT

An improved and new structure and method for forming a guard ring in an integrated circuit having at least one level of polysilicon wiring has been developed. The guard ring is formed without necessitating additional manufacturing process steps and the guard ring is bonded to the semiconductor substrate, thereby providing a superior barrier to diffusion of moisture and contaminants from a window in the insulating layers to the semiconductor device regions.

23 Claims, 3 Drawing Sheets

METHOD OF FORMING A MOISTURE GUARD RING FOR INTEGRATED CIRCUIT APPLICATIONS

BACKGROUND OF THE INVENTION

1. Field of the Invention

This invention relates to a method of fabrication used for semiconductor integrated circuit devices, and more specifically to a structure and method for producing integrated circuits with multiple polysilicon wiring layers having an improved contamination guard ring for circuit redundancy applications and laser repair alignment mark applications.

2. Description of Related Art

Integrated circuits often include fusible conductive links that may be rendered non-conductive by running a high current through them. The conductive links can also be rendered nonconductive by applying laser energy with a laser repair machine. A serious disadvantage of such fusible link regions, as well as of alignment mark regions, is that both frequently lower chip yield and reliability by allowing moisture and other contaminates to penetrate to the device regions of the semiconductor circuits.

An important challenge is to improve the reliability of the semiconductor devices surrounding fusible links and alignment mark regions and it has become customary to provide a guard ring of moisture impervious material to surround the region of the fusible link or the region of the alignment mark in order to block the penetration of moisture and other contaminates from reaching the device areas.

For example, U.S. Pat. No. 5,567,643 entitled "Method of Forming Contamination Guard Ring For Semiconductor Integrated Circuit Applications" granted Oct. 22, 1996 to Jin-Yuan Lee et al describes a process of forming a guard ring that uses two water impervious layers; e.g. first and second metal layers bonded to the silicon substrate.

Also, U.S. Pat. No. 5,538,924 entitled "Method of Forming a Moisture Guard Ring For Integrated Circuit Applications" granted Jul. 23, 1996 to Chung-zen Chen shows a guard ring composed of a polysilicon layer and a metal layer and a silicon nitride barrier layer.

And, U.S. Pat. No. 5,444,012 entitled "Method For Manufacturing Semiconductor Integrated Circuit Device Having a Fuse Element" granted Aug. 22, 1995 to Keiichi Fukuda al describes a guard ring composed of three layers of wiring material; i.e. lower TiW, aluminum alloy, and upper TiW. This guard ring is not bonded to the silicon substrate.

Unless the guard ring is bonded to the semiconductor substrate the effectiveness of the guard ring in preventing diffusion of moisture and contaminants from a window in the insulation layers to the device regions is attenuated. Also, it is desirable to be able to form the guard ring without introducing extra processing steps and extra layers into the manufacturing process for the integrated circuit.

SUMMARY OF THE INVENTION

It is a general object of the present invention to provide an improved structure and method of forming an integrated circuit contamination guard ring for use in an integrated circuit having multiple polysilicon wiring levels.

A more specific object of the present invention is to provide an improved structure and method of forming an integrated circuit guard ring, in an integrated circuit having multiple polysilicon wiring levels, which prevents contamination from diffusing through a window opening in the insulating layer to the device regions of the integrated circuit.

Another object of the present invention is to provide an improved structure and method of forming an integrated circuit guard ring, in an integrated circuit having at least one level of polysilicon wiring, wherein the polysilicon forms a guard ring barrier sealed to the semiconductor substrate.

A further object of the present invention is to provide an improved structure and method of forming an integrated circuit guard ring, in an integrated circuit having at least one level of polysilicon wiring, wherein the guard ring is formed without necessitating additional manufacturing process steps.

In accordance with the present invention, the above and other objectives are realized by using a method of fabricating a guard ring about a fusible link on a semiconductor substrate containing device regions, comprising the steps of: providing said semiconductor substrate containing device regions; forming a first insulating layer over portions of the semiconductor substrate; forming a fuse link comprising a first polysilicon layer on the first insulating layer; forming a second insulating layer over the fuse link and the first insulating layer; forming first split annular openings through the second insulating layer and through the first insulating layer to expose the semiconductor substrate surface; forming a second polysilicon layer in the first split annular openings in contact with the semiconductor substrate surface; forming a third insulating layer overlying the second polysilicon layer and the second insulating layer; forming a second annular opening in the third insulating layer that surrounds the fusible link and exposes the second polysilicon layer; forming a first metal layer in the second annular opening in contact with the second polysilicon layer; forming a fourth insulating layer overlying the first metal layer and the third insulating layer; forming a third annular opening in the fourth insulating layer that surrounds the fusible link and exposes the first metal layer; forming a second metal layer in the third annular opening in contact with the first metal layer; forming a fifth insulating layer overlying the second metal layer and the fourth insulating layer; and forming a window opening over the fuse link.

In a second embodiment of the present invention, the above and other objectives are realized by using a method of fabricating a guard ring about a window opening in insulating layers in a window area containing an alignment mark on a semiconductor substrate comprising: forming a first insulating layer over portions of the semiconductor substrate; forming a second insulating layer over the first insulating layer; forming first annular openings through the second insulating layer and through the first insulating layer to expose the semiconductor substrate surface; forming a polysilicon layer in the first annular openings in contact with the semiconductor substrate surface; forming a third insulating layer overlying the polysilicon layer and the second insulating layer; forming a second annular opening in the third insulating layer that exposes the polysilicon layer; forming a first metal layer in the second annular opening in contact with the polysilicon layer, and forming an alignment mark over the window area; forming a fourth insulating layer overlying the first metal layer and the third insulating layer; forming a third annular opening in the fourth insulating layer that exposes the first metal layer; forming a second metal layer in the third annular opening in contact with the first metal layer, and forming an alignment mark over the window area; forming a fifth insulating layer overlying the second metal layer and the fourth insulating layer; and forming a window opening in the fifth insulating layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved structure and method for fabricating an integrated circuit having at least one level of polysilicon wiring, wherein the guard ring is formed without necessitating additional manufacturing process steps, will now be described in detail. The invention has two embodiments: A.) A guard ring structure formed around a window opening containing a fusible link and B.) A guard ring structure completely surrounding a window opening, as applied to a guard ring around laser repair alignment marks.

The method of the present invention will be described as a guard ring around a fusible link and an alignment mark, but is not limited to these applications. The guard ring can be applied to other structures as well. Moreover, the location of the polysilicon fusible link is on the first insulating layer, but the polysilicon fusible link may in practice be located on any insulating layer in the integrated circuit. Also, while five insulating layers are described in this invention, the actual number and composition of the layers may vary.

A. A Guard Ring Around A Window Opening Containing A Fusible Link

Figure 1:
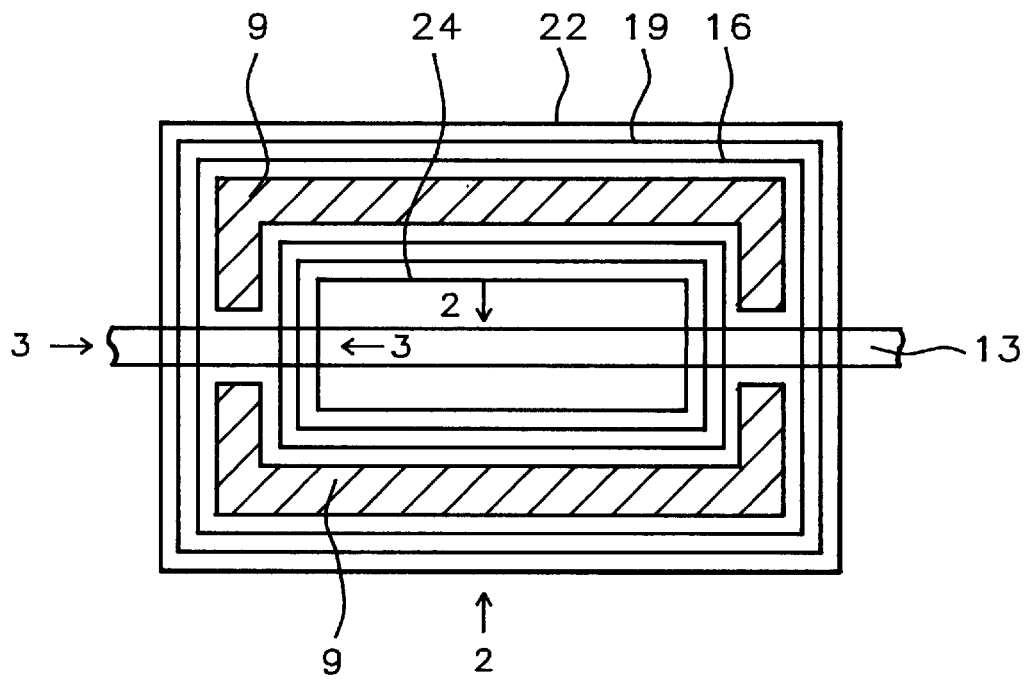
FIG. 1, which is a top plan view of the guard ring of the invention surrounding a fusible link located in a window opening.
Figure 2:
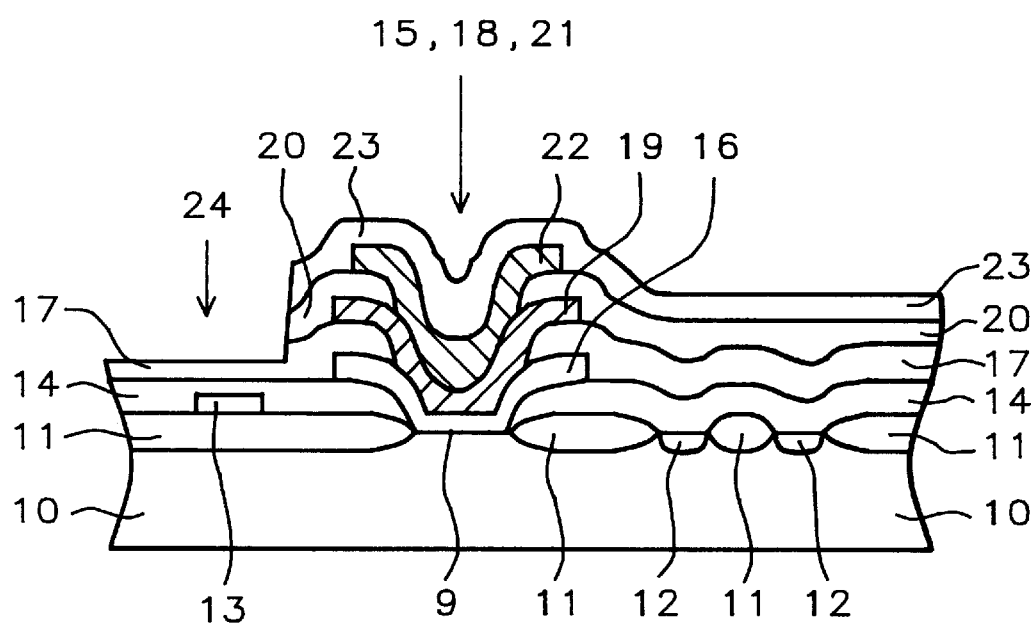
FIG. 2, which is a cross-sectional view of the guard ring of the invention taken along line 2 in FIG. 1.

As shown in FIGS. 1 and 2, a first insulating layer 11 is formed over portions of the semiconductor substrate 10 containing device regions 12. The first insulating layer 11 is preferably formed of thick silicon oxide, sometimes referred to as field oxide. Silicon oxide can be grown at atmospheric pressure at 700° to 1200° C. in a wet or dry oxygen ambient in a thermal furnace. First insulating layer 11 has a thickness in the range between about 3000 and 4000 Angstroms and preferably a thickness of approximately 3500 Angstroms. Subsequently, a fusible link 13 is formed on the first insulating layer 11. Fusible link 13 is preferably formed of a first polysilicon layer, but can also be formed of a polycide such as titanium polycide or tungsten polycide. Fusible link 13 typically has a thickness range between about 2000 and 4000 Angstroms and a length in the range between about 5 and 10 microns. The width of the fusible link is typically between about 1 and 3 microns.

Next, a second insulating layer 14 is formed over the fusible link 13 and the first insulating layer 11. The second insulating layer can be formed of LPTEOS oxide or $O_3$-TEOS oxide and have a thickness range between about 1500 and 2500 Angstroms and preferably a thickness of approximately 2000 Angstroms.

Split annular openings 15 are formed through the second insulating layer 14 and the first insulating layer 11 exposing the semiconductor substrate surface 9. The split annular openings 15 and subsequent annular openings in insulating layers can be formed by conventional lithographic mask and etch processes. The split annular openings 15 have a width in the range between about 0.3 and 10.0 microns and preferably a width of approximately 0.6 microns.

Figure 3:
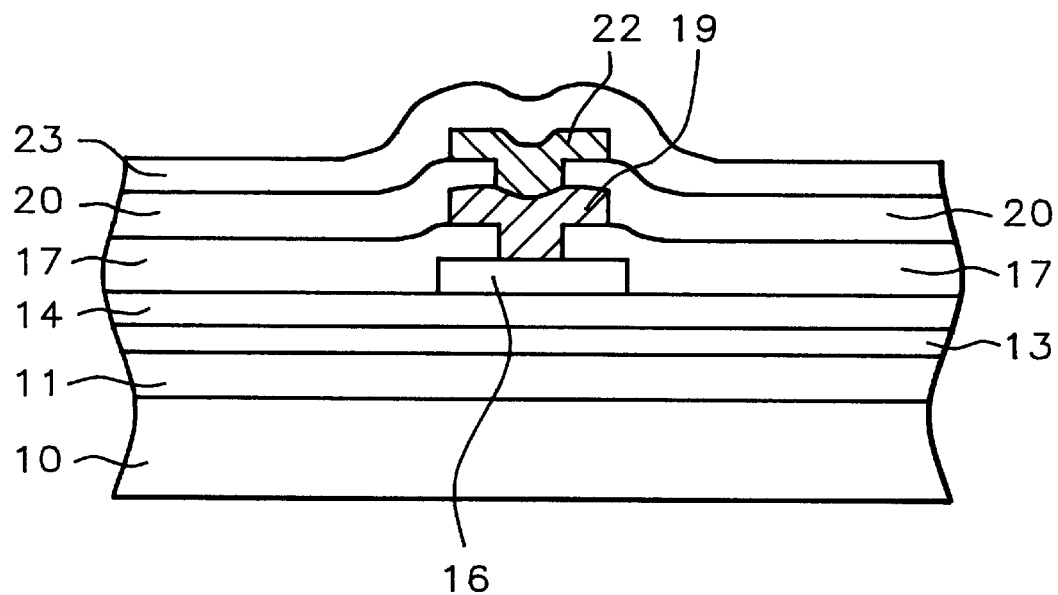
FIG. 3, which is a cross-sectional view of the guard ring of the invention taken along line 3 in FIG. 1.

A second polysilicon layer 16 is formed in the split annular openings 15, as shown in FIG. 2 and overlying the second insulating layer 14 where the guard ring overlies the fusible link 13, as shown in FIG. 3.

Next, a third insulating layer 17 is formed over the second polysilicon layer 16 and the second insulating layer 14. The third insulating layer can be formed of $O_3$-TEOS oxide or BPTEOS oxide and have a thickness range between about 6000 and 8000 Angstroms and preferably a thickness of approximately 7000 Angstroms.

Second annular openings 18 are formed through the third insulating layer 17 exposing the surface of the second polysilicon layer 16. The second annular openings 18 have a width in the range between about 0.3 and 10.0 microns and preferably a width of approximately 0.6 microns.

A first metal layer 19 is formed in the second annular openings 18 and in contact with the second polysilicon layer 16. First metal layer 19 can be formed of aluminum, aluminum-alloy, titanium, titanium-alloy, tungsten and tungsten-alloy, having a thickness in the range between about 3500 and 4500 Angstroms and preferably approximately 4000 Angstroms. The width of the first metal layer 19 is in a range between about 0.5 and 10.0 microns.

Next, a fourth insulating layer 20 is formed over the first metal layer 19 and the third insulating layer 17. The fourth insulating layer can be formed of PEOX/SOG/PEOX and have a thickness range between about 6000 and 8000 Angstroms and preferably a thickness of approximately 7000 Angstroms.

Third annular openings 21 are formed through the fourth insulating layer 20 exposing the surface of the first metal layer 19. The third annular openings 21 have a width in the range between about 0.3 and 10.0 microns and preferably a width of approximately 0.6 microns.

A second metal layer 22 is formed in the third annular openings 21 and in contact with the first metal layer 19. Second metal layer 22 can be formed of aluminum, aluminum-alloy, titanium, titanium-alloy, tungsten and tungsten-alloy, having a thickness in the range between about 5000 and 7000 Angstroms and preferably approximately 6000 Angstroms. The width of the second metal layer 22 is in a range between about 0.5 and 10.0 microns.

A fifth insulating layer 23 is formed over the second metal layer 22 and the fourth insulating layer 20. The fifth insulating layer can be formed of PEOX/PESiN and have a thickness range between about 8000 and 10,000 Angstroms and preferably a thickness of approximately 9000 Angstroms. Finally a window opening 24 is formed over the fusible link 13. The guard ring prevents moisture and contaminants from diffusing from the window openings 24 to the device areas in the semiconductor substrate.

B. A Guard Ring For Alignment Marks Areas

In the second embodiment of the invention the guard ring contacts the substrate around the entire periphery of the window opening whereas in the first embodiment the guard ring did not contact the substrate where the guard ring passed over the fusible link. The window opening can contain any structure such as laser repair alignment marks.

Figure 4:
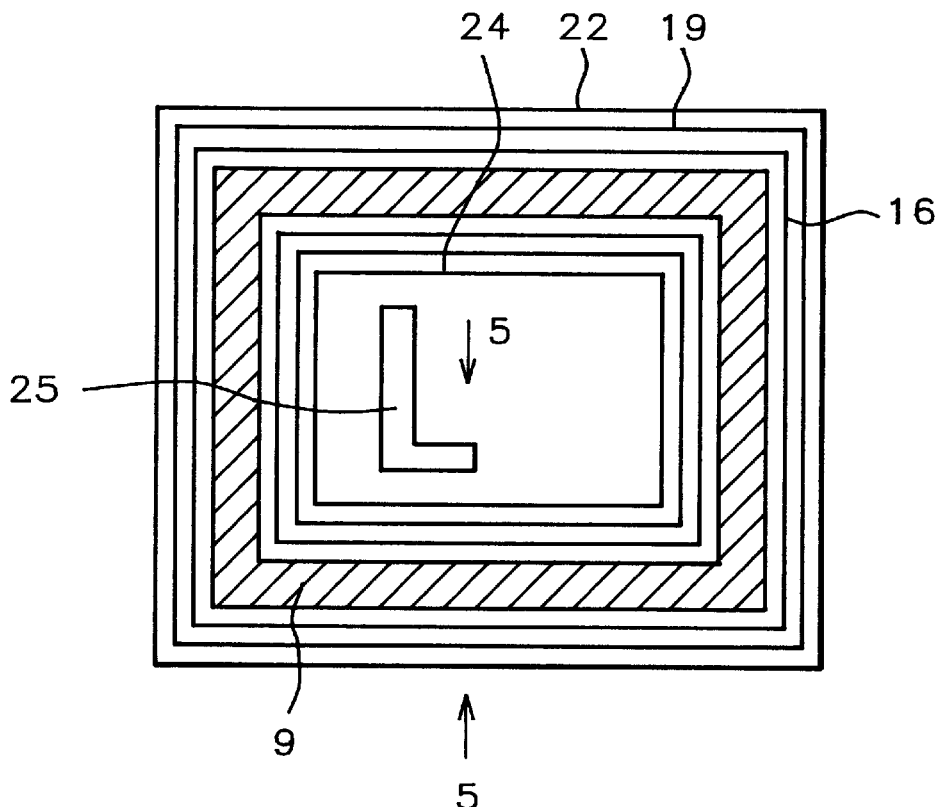
FIG. 4, which is a top plan view of the guard ring of the invention surrounding a laser alignment mark located in a window opening.
Figure 5:
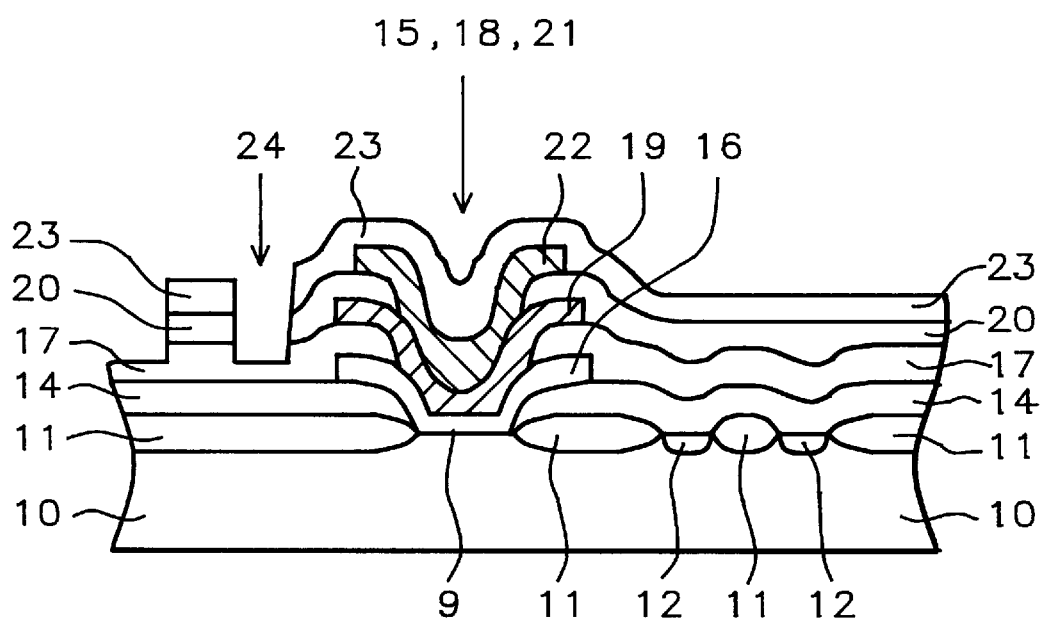
FIG. 5, which is a cross-sectional view of the guard ring of the invention taken along line 5 in FIG. 4.

FIG. 4 shows a top plan view of a guard ring around an alignment mark and FIG. 5 shows a cross-sectional view of the alignment mark 25 and guard ring structure taken along axis 5. The polysilicon/first metal/second metal guard ring fully surrounds the window opening 24 and is in contact with the semiconductor substrate 10. The basic processing steps are the same for the first and second embodiments. Only lithographic steps will be different.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a guard ring about a fusible link on a semiconductor substrate containing device regions, comprising the steps of:

providing said semiconductor substrate containing device regions;

forming a first insulating layer over portions of the semiconductor substrate;

forming a fuse link comprising a first polysilicon layer on the first insulating layer;

forming a second insulating layer over the fuse link and the first insulating layer;

forming first split annular openings through the second insulating layer and through the first insulating layer to expose the semiconductor substrate surface;

forming a second polysilicon layer in said first split annular openings in contact with the semiconductor substrate surface;

forming a third insulating layer overlying the second polysilicon layer and the second insulating layer;

forming a second annular opening in said third insulating layer that surrounds the fusible link and exposes the second polysilicon layer;

forming a first metal layer in said second annular opening in contact with said second polysilicon layer;

forming a fourth insulating layer overlying the first metal layer and the third insulating layer;

forming a third annular opening in said fourth insulating layer that surrounds the fusible link and exposes the first metal layer;

forming a second metal layer in said third annular opening in contact with said first metal layer;

forming a fifth insulating layer overlying the second metal layer and the fourth insulating layer; and forming a window opening over the fuse link.

2. The method of claim 1, wherein in the area where the guard ring overlies over the fuse link, the second polysilicon layer is formed overlying the second insulating layer.

3. The method of claim 1, wherein the first insulating layer is formed of silicon oxide having a thickness in the range between about 3000 and 4000 Angstroms.

4. The method of claim 1, wherein the second insulating layer is formed of LPTEOS oxide or $O_3$-TEOS oxide having a thickness in the range between about 1500 and 2500 Angstroms.

5. The method of claim 1, wherein the third insulating layer is formed of $O_3$-TEOS oxide or BPTEOS oxide having a thickness in the range between about 6000 and 8000 Angstroms.

6. The method of claim 1, wherein the fourth insulating layer is formed of PEOX/SOG/PEOX having a thickness in the range between about 6000 and 8000 Angstroms.

7. The method of claim 1, wherein the fifth insulating layer is formed of PEOX/PESiN having a thickness in the range between about 8000 and 10,000 Angstroms.

8. The method of claim 1, wherein the first polysilicon layer has a thickness in the range between about 2000 and 4000 Angstroms.

9. The method of claim 1, wherein the second polysilicon layer has a thickness in the range between about 1500 and 2500 Angstroms.

10. The method of claim 1, wherein the first metal layer is composed of a metal selected from the following group: titanium, titanium-alloy, aluminum, aluminum-alloy, tungsten and tungsten-alloy, having a thickness in the range between about 3500 and 4500 Angstroms.

11. The method of claim 1, wherein the second metal layer is composed of a metal selected from the following group: titanium, titanium-alloy, aluminum, aluminum-alloy, tungsten and tungsten-alloy, having a thickness in the range between about 3500 and 7000 Angstroms.

12. The method of claim 1, wherein said first split annular openings and said second and third annular openings have a width in the range between about 0.3 and 10 microns.

13. A method of fabricating a guard ring about a window opening in insulating layers in a window area containing an alignment mark on a semiconductor substrate comprising:

forming a first insulating layer over portions of the semiconductor substrate;

forming a second insulating layer over said first insulating layer;

forming first annular openings through the second insulating layer and through the first insulating layer to expose the semiconductor substrate surface;

forming a polysilicon layer in said first annular openings in contact with the semiconductor substrate surface;

forming a third insulating layer overlying the polysilicon layer and the second insulating layer;

forming a second annular opening in said third insulating layer that exposes the polysilicon layer;

forming a first metal layer in said second annular opening in contact with said polysilicon layer, and forming an alignment mark over said window area;

forming a fourth insulating layer overlying the first metal layer and the third insulating layer;

forming a third annular opening in said fourth insulating layer that exposes the first metal layer;

forming a second metal layer in said third annular opening in contact with said first metal layer, and forming an alignment mark over said window area;

forming a fifth insulating layer overlying the second metal layer and the fourth insulating layer; and forming a window opening in the fifth insulating layer.

14. The method of claim 13, wherein the first insulating layer is formed of silicon oxide having a thickness in the range between about 3000 and 4000 Angstroms.

15. The method of claim 13, wherein the second insulating layer is formed of LPTEOS oxide or $O_3$-TEOS oxide having a thickness in the range between about 1500 and 2500 Angstroms.

16. The method of claim 13, wherein the third insulating layer is formed of BPTEOS oxide having a thickness in the range between about 6000 and 8000 Angstroms.

17. The method of claim 13, wherein the fourth insulating layer is formed of PEOX/SOG/PEOX having a thickness in the range between about 6000 and 8000 Angstroms.

18. The method of claim 13, wherein the fifth insulating layer is formed of PEOX/PESiN having a thickness in the range between about 8000 and 10,000 Angstroms.

19. The method of claim 13, wherein the polysilicon layer has a thickness in the range between about 2000 and 4000 Angstroms.

20. The method of claim 13, wherein the first metal layer is composed of a metal selected from the following group: titanium, titanium-allow, aluminum, aluminum-alloy, tungsten and tungsten-alloy, having a thickness in the range between about 3500 and 4500 Angstroms.

21. The method of claim 13, wherein the second metal layer is composed of a metal selected from the following group: titanium, titanium-alloy, aluminum, aluminum-alloy, tungsten and tungsten-alloy, having a thickness in the range between about 5000 and 7000 Angstroms.

22. The method of claim 13, wherein said first, annular openings, said second annular openings and said third annular openings have a width in the range between about 0.3 and 10 microns.

23. A method of fabricating a guard ring about a fusible link of a semiconductor substrate comprising the steps of:

forming a first insulating layer composed of silicon oxide over portions of the semiconductor substrate;

forming a fuse link comprising a first polysilicon layer on the first insulating layer;

forming a second insulating layer composed of LPTEOS oxide or $O_3$-TEOS oxide over the fuse link and the first insulating layer;

forming first split annular openings through the second insulating layer and through the first insulating layer to expose the semiconductor substrate surface;

forming a second polysilicon layer in said first split annular openings in contact with the semiconductor substrate surface, said second polysilicon layer overlying the second insulating layer in the area overlying said fuse link;

forming a third insulating layer composed of BPTEOS oxide overlying the second polysilicon layer and the second insulating layer;

forming a second annular opening in said third insulating layer that surrounds the fusible link and exposes the second polysilicon layer;

forming a first annular metal layer in said second annular opening in contact with said second polysilicon layer;

forming a fourth insulating layer composed of PEOX/SOG/PEOX overlying the first annular metal layer and the third insulating layer;

forming a third annular opening in said fourth insulating layer that surrounds the fusible link and exposes the first metal layer;

forming a second annular metal layer in said third annular opening in contact with said first metal layer;

forming a fifth insulating layer composed of PEOX/PESiN overlying the second annular metal layer and the fourth insulating layer; and forming a window opening over the fuse link.

* * * * *